United States Patent [19]

Reich

[11] Patent Number: 4,692,387
[45] Date of Patent: Sep. 8, 1987

[54] SINTERING OF METAL INTERLAYERS WITHIN ORGANIC POLYMERIC FILMS

[75] Inventor: Shymon Reich, Rehovoth, Israel

[73] Assignee: E. I. Du Pont de Nemours and Company, Wilmington, Del.

[21] Appl. No.: 874,817

[22] Filed: Jun. 12, 1986

Related U.S. Application Data

[63] Continuation-in-part of Ser. No. 657,011, Oct. 2, 1984, abandoned.

[51] Int. Cl.$^4$ ................................................ B22F 3/00
[52] U.S. Cl. ..................................... 428/545; 75/230; 204/DIG. 11; 419/5; 419/10; 427/53.1; 428/219; 428/220; 428/458; 428/539.5
[58] Field of Search ............ 419/5, 10; 427/53.1; 428/219, 220, 458, 539.5, 545; 204/DIG. 11; 75/230

[56] References Cited

U.S. PATENT DOCUMENTS

| | | | |
|---|---|---|---|
| 3,864,124 | 2/1975 | Breton et al. | 419/10 |
| 3,917,149 | 4/1975 | Breton et al. | 419/9 |
| 4,055,615 | 10/1977 | Ikeda | 419/10 |
| 4,197,118 | 4/1980 | Wiech, Jr. | 75/228 |
| 4,283,360 | 8/1981 | Henmi et al. | 264/63 |
| 4,416,914 | 11/1983 | Eichelberger et al. | 427/96 |
| 4,512,855 | 4/1985 | Mazur | 204/20 |
| 4,522,888 | 6/1985 | Eichelberger et al. | 428/546 |

OTHER PUBLICATIONS

Berry et al., "Thin Film Technology", D. van Nostrand Co., Inc.; Princeton, NJ, 1968, pp. 1-17.
Roff et al., "Photographic Silver Halide Diffusion Processes", The Focal Press, London and New York, 1972, pp. 13-31.
Haushalter et al., Thin Solid Films, 102, 161 (1983).
Bruce et al., J. Phys. Chem., 86, 1552 (1982).
Bruce et al., J. Am. Chem. Soc., 104, 74 (1982).
Pickup et al., J. Electrochem. Soc., 130, 2205 (1983).
Paek et al., J. Appl. Phys., 44, 2260 (1973).
Jipson et al., Solid State Technology, p. 141, Jan., 1984.
Drexler, J. Vac. Sci. Technol., 18, 87 (1981).
Craighead et al., Appl. Phys. Lett., 39, 1981.
Kirkpatrick, Rev. of Mod. Phys., 45, 574 (1973).

Primary Examiner—Stephen J. Lechert, Jr.

[57] ABSTRACT

Process for modifying in situ the electrical and/or optical properties of an electrochemically-deposited interlayer within a polyimide film, the interlayer being comprised of particulate silver and/or gold, by heating the interlayer, either in its entirety or in a spatially selective manner, so as to sinter the particulate silver and/or gold without adversely affecting the properties of the polyimide, and the film structure produced thereby.

19 Claims, 9 Drawing Figures

SINTERING OF METAL INTERLAYERS WITHIN ORGANIC POLYMERIC FILMS

This is a continuation-in-part of application Ser. No. 657,011 filed Oct. 2, 1984 now abandoned.

BACKGROUND OF THE INVENTION

1. Field of the Invention

This invention relates to the sintering of metal interlayers within organic polymeric films.

2. Background

There exist in the art many different chemical or physical methods by which a zero-valent metal can be added to a polymeric film. Among these, some are capable of producing a thin continuous coating at a surface of the polymer, for example, meal vapor deposition or electroless plating, as disclosed by R. W. Berry, P. M. Hall, and M. T. Harris, "Thin Film Technology", D. van Nostrand Co., Inc.; Princeton, N.J. 1968, pp. 1-17. The electrical continuity and/or optical reflectivity of such a coating forms the basis for a variety of technological applications. Other processes, such as silver halide photography (A. Roff and E. Weyde, "Photographic Silver Halide Diffusion Processes", The Focal Press, London and New York, 1972, pp. 13-31) and certain forms of chemical (R. C. Haushalter and L. J. Krause, Thin Solid Films, 102, 161 (1983)) or electrochemical (J. A. Bruce, J. Murahashi, and M. S. Wrighton, J. Phys. Chem., 86, 1552 (1982)) deposition, produce metal particles embedded within the polymer film. However, these particles are generally dispersed to such a degree that they lack the characteristic electrical or optical properties of a continuous metal layer.

Certain organic or organometallic polymers have been described in the literature, for example, J. A. Bruce and M. S. Wrighton, J. Am. Chem. Soc., 104, 74 (1982), and publications cited therein, as "electrochemically active". When coated as a film on the surface of an electrode, these polymers can accept and/or donate electrons to the electrode at a potential dictated by the redox potential of the polymer. This redox process may involve not only the surface of the polymer in contact with the electrode, but all of the redox-active groups throughout the sample. This behavior requires that both electrons and counterions have some finite mobility within the polymer.

A report by P. G. Pickup, K. M. Kuo, and R. J. Murray, J. Electrochem. Soc., 130, 2205 (1983), describes their study of electrodeposition of metals (Cu, Ag, Co and Ni) from solution onto electrodes coated with the electrochemically active polymer poly-[Ru(bpy)$_2$(vpy)$_2$]$^{n+}$. At potentials sufficiently negative to reduce the polymer to Ru(I) or Ru(O) these authors report that the metal ions, for example, Cu$^{+n}$, Ag$^+$, are reduced by the polymer to form particles or films on the surface of the polymer facing the solution. They further consider the general aspects of such a process and speculate about alternative possible results from those observed. They conclude that the locus of metal deposition depends on the relative rates of the steps: (1) diffusion of metal ions through the polymer to the Pt electrode; (2) diffusion of electrons through the polymer from the Pt electrode; and (3) reduction of the metal ions by the reduced polymer. In particular, they conclude that in order to obtain metal deposition within the polymer, it would be necessary that steps 1 and 2 be equally fast and step 3 must be faster.

Haushalter and Krause, supra, disclose the chemical reduction of organic polymers, especially polyimides, by treatment with certain strongly-reducing main-group metal cluster compounds, Zintl ions. This process was employed for two different kinds of metallization processes. First, main group metals, derived from oxidation of the Zintl ions, were deposited on the surface of the polymer. Secondly, the reduced form of the polymer was reacted with metal salts from solution to generate zero-valent metal particles by a process which is formally equivalent to the electrochemical depositions of Bruce et al., and Pickup et al., supra. The Zintl ions were obtained either by extraction, for example, with ethylenediamine, of a Zintl phase (an alloy of a polyatomic main group element, for example, germanium, tin, lead, arsenic or antimony, with an alkali or alkaline earth metal) or by electrolysis of a main group electrode. Metallization of a polyimide of 4,4'-diaminodiphenyl ether, also referred to herein as 4,4'-oxydianiline, and pyromellitic anhydride, also referred to herein as pyromellitic dianhydride, is disclosed.

In U.S. Pat. No. 4,512,855 now U.S. Pat. No. 4,512,855, S. Mazur discloses a process which is capable of producing, in a single step, a thin layer of metal completely embedded within a polymeric film, that is, an interlayer. By means of this process, it is possible to control both the thickness of the interlayer(s) and its position(s) within the polymeric film. Most notably, such an interlayer(s) may possess sufficient continuity and planarity to exhibit electrical and optical characteristics hitherto available only with surface layers. By "interlayer" in meant a discrete metal laminar region embedded within, and parallel to, the polymeric film, the laminar region being thinner in the transverse direction than said film and the density of the metal within said region being greater than the density of metal on either side of the region.

Sintering of metal particles is employed in the art for a broad range of commercially important applications with the object of increasing the mechanical inegrity and/or electrical conductivity of a "green formed" object. The general utility of sintering resides in the fact that it occurs at temperatures much below the melting point of the metal; therefore, the original geometric shape of the object is maintained. The green formed object may be composed purely of metal particles pressed together, for example, by compression molding, or it may also contain an organic material, such as a polymer, acting as a binder. In the latter instance (see, for example, U.S. Pat. Nos. 4,197,118 and 4,283,360) the polymer is a transient component of the system and is either removed or decomposed during the sintering process. It is not a functional component of the final sinered part.

There are many examples of the use of a laser to selectively alter the optical or electrical properties of thin metal films. In most instances these metal films are supported on the surface of a substrate (for example, glass, ceramic, organic polymer). Thus, ablation of thin metal surface layers has been used to create conductive circuit patterns (Paek and Kestenbaum, J. Appl. Phys., 44, 2260 (1973)). Also, such techniques have been developed for application in the area of optical information storage, where digital information is encoded as microscopic dots, distinguished from their background by virtue of a difference in reflectivity. This information may be written onto or into a suitable medium by means of a laser. As described by Jipson and Ahn, Solid State Technology, p. 141, January, 1984, and Drexler, J. Vac. Sci. Technol., 18, 87 (1981), a number of different principles have been exploited to obtain the necessary laser sensitivity:

1. Ablation: A thin layer on top or embedded within a substrate is ablatively removed by the laser.
2. Bilayer Alloying: A eutectic alloy is created at the interface between two components of the active layer.
3. Smoothing of a Textured Surface: The surface of the active layer is prepared in a roughened antireflective form. Heat from the laser melts the surface and smooths it to increase the reflectivity. (Craighead and Howard, Appl. Phys. Lett., 38, 1981).
4. Island Formation: Where an extremely thin fold film is heated by the laser, it coalesces into isolated islands, resulting in greatly reduced reflectivity.
5. Vesicle Formation: Heat from the laser causes formation of a vesicle or bubble between the active layer and the substrate. Distortion of the surface reduces its reflectivity.
6. Phase Change: Laser heating of a glassy, optically transmissive material causes it to crystallize. The crystalline form scatters light and thereby prevents reflection from a secondary layer beneath the active layer.
7. Distortion of the Substrate: A reflective metal layer absorbs the light and causes local heating of the substrate. Melting of the substrate results in distortion of the reflective surface with consequent decrease in reflectivity.

Principle 3 above employs a sintering process to smooth an optically rough surface. The use of sintering to enhance the reflectivity of an already optically flat surface is not disclosed in the art.

It is an object of this invention to provide a method for systematically altering the electrical conductivity and optical characteristics (reflectivity and transmissivity) of the aforesaid interlayer disclosed by S. Mazur (U.S. Pat. No. 4,512,855) so as to provide an interlayer having properties ranging from those of the bulk metal to those of the polymer matrix, without degrading or otherwise adversely affecting the polymer. Other objects will become apparent hereinafter.

DETAILED DESCRIPTION OF THE INVENTION

For further comprehension of the invention and of the objects and advantages thereof, reference may be made to the following description, including the examples, the accompanying drawings, and the appended claims in which the various novel features are more particulary set forth.

The electrical transport properties of heterogeneous materials composed of an electronic conductor dispersed in an insulator has been a focus of interest for both practical and theoretical reasons. It is generally recognized that measurements of dc conductivity for such materials, made over distances much larger than the characteristic dimensions of the component phases, can change dramatically as a function of the relative volume fraction of the components. As the volume fraction of conductive component is increased, the overall dc conductivity can increase by many orders of magnitude, a form of insulator-to-conductor transition. As an example of a theoretical treatment of such a system, see S. Kirkpatrick, Rev. of Mod. Phys., 45, 574 (1973)).

S. Mazur, supra U.S. Pat. No. 4,512,855, discloses a method for growing a metal interlayer within a polymeric film by a process wherein electrons supplied by the polymer in its reduced form react with metal ions diffusing into the polymer from solution. The interlayers generated by this process consist of microscopic metal particles distributed within a restricted region of the polymer film, the position and extent of that region being governed by the fluxes of electrons and ions within the film and the total amount of metal incorporated. Bu means of this method can be produced, for example, a silver interlayer within a film of a polyimide of 4,4'-oxydianiline and pyromellitic dianhydride (ODA-PMDA), with the volume fraction of silver within the interlayer being as high as 71%. The dc conductivity of such an interlayer was found to be 1,700 (ohm cm)$^{-1}$, that is, 0.25% that of silver metal. Similarly, the reflectivity of the optically flat surface of the interlayer was found to be no higher than 36%, which corresponds to a conductivity at optical frequencies of 1,800 (ohm cm)$^{-1}$. Such results were taken to suggest that the connectivity of the silver particles, that is, a measure of the degree of contact between the particles, as deposited within the interlayer, is poor.

The invention herein is an improvement over the aforesaid interlayer of S. Mazur (U.S. Pat. No. 4,512,855) in that marked improvement in the electrical contact between the metal particles has been achieved by sintering at such temperature that the polymer is not adversely affected. Furthermore, if a laser is employed to selectively heat limited regions of the metal interlayer of S. Mazur (U.S. Pat. No. 4,512,855), the sintering process can be used to produce two-dimensional patterns consisting of variations of electrical conductivity and/or optical reflectivity and transmissivity. More specifically, mild sintering conditions increase the electrical continuity between microparticles, resulting in enhanced conductivity and reflectivity, while more extreme conditions, as obtained, for example, from more intense laser exposure, result in formation of isolated particles whose diameters exceed the thickness of the original interlayer, with a consequent loss in electrical conductivity and reflectivity but an increase in transmissivity.

In a preferred embodiment the resides in a sintered silver or gold interlayer, or a plurality of such interlayers, within a polyimide film, the unsintered interlayer(s)/organic polymeric film being of the aforesaid type disclosed by S. Mazur (U.S. Pat. No. 4,512,855). The invention provides a means for adjusting the electrical conductivity of the interlayer in a continuous fashion, in situ, from its initial value to as much as within 10% of the value for the bulk metal, and in a discontinuous fashion to a lower limit equal to the electrical conductivity of the polymer matrix. If at least one surface of the interlayer is optically flat, then the optical reflectivity of that surface can be altered by the process of the invention in a continuous fashion from its initial value to an upper limit corresponding to the reflectivity of the bulk metal, and in a discontinuous fashion to a lower limit of zero. These changes are brought about by thermally sintering the microscopic metal particles which make up the interlayer of S. Mazur (U.S. Pat. No. 4,512,855). This sintering may involve heating the entire sample, or it may be accomplished in a spatially regulated manner by exposing selected regions of the interlayer to a heat source, for example, by irradiating with a laser. When the thermal exposure of the entire sample falls within the range about 150° C. to about 450° C., preferably 300° C. to 450° C., for example, for about ten minutes to three hours, or upon spatially regulated thermal exposure of the sample by means of a laser at appropriate power density and exposure time, for example, for as short a time as 200 nanoseconds, the conductivity and reflectivity of the interlayer, either in its entirety or in spatially controlled portions thereof, are increased. When exposed to laser radiation in excess of that whereby the maxima of conductivity and reflectivity have benn achieved, the interlayer can be disintegrated, in a spatially controlled manner, into isolated metal particles, resulting in loss of electrical conductivity and optical reflectivity in the overexposed areas. Provided that the laser is of a wavelength which is not strongly absorbed by the polymer, both kinds of transformation can be achieved without apparent decomposition of the polymer.

For use in this invention the laser should be able to provide an energy density output of about 0.1 to less than 1.0, preferably 0.1 to 0.5, more preferably 0.3 to 0.4, Joule/cm$^2$ at a wavelength of 1 $\mu$m to 450 nm within the time range 200 nanoseconds to 1 millisecond to achieve the effects of increased conductivity and reflectivity. Lasers providing a greater exposure than the above, but below that which may adversely affect the organic polymeric film, may be used to achieve an ultimate decrease in conductivity and reflectivity.

Figure 1:
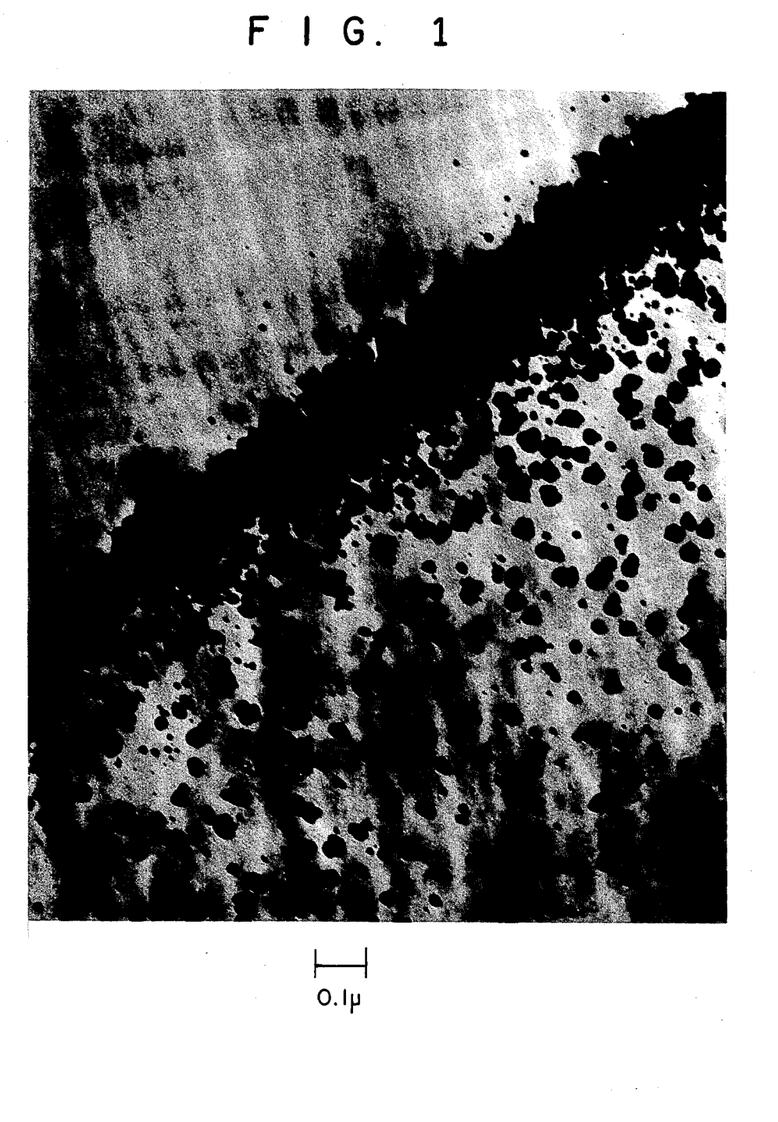
FIG. 1 depicts a transmission electron micrograph of a microtomed cross-section of an electrochemically-deposited silver interlayer in a polyimide film, representative of a structure obtained by the process of S. Mazur, supra, carried gut under steady-state conditions.

FIG. 1 depicts a transmission electron micrograph (TEM) of a microtomed cross-section of a typical example of a silver interlayer in a polyimide film (0.316 mg Ag/cm$^2$ in a 10 $\mu$m thick ODA/PMDA polyimide film) prepared by the method of S. Mazur, supra, U.S. Pat. No. 4,512,855. The scale bar in FIG. 1 represents 0.1 $\mu$m (1,000 A), the film thickness is 10 $\mu$m (100,000 A) and the dense region of the interlayer is 0.2 $\mu$m (2,000 A). It may be noted that the particles which make up the interlayer are considerably smaller in diameter than the interlayer thickness and are approximately spherical. The average particle diameter was determined using small angle X-ray scattering (SAXS) and found to be 154 A (0.0154 $\mu$m). One or more factors may be involved in the poor connectivity between the particles; for example, it may be due to a geometric factor, that is, two adjacent spheres may contact only at a point, or there may be a thin skin of polymer surrounding each particle, which prevents it from making direct contact with adjacent particles. It has been discovered that heating these materials to temperatures as low as about 150° C. can result in unexpected and simultaneous marked increases in electrical conductivity and optical reflectivity and systematic changes in the morphology of the interlayer, all of which are consistent with the phenomenon of sintering. Surprisingly, these effects can be achieved without adversely affecting the organic polymeric film which surrounds the interlayer. The table in Example 3 shows changes in electrical conductivity measured before and after sintering.

Figure 2:
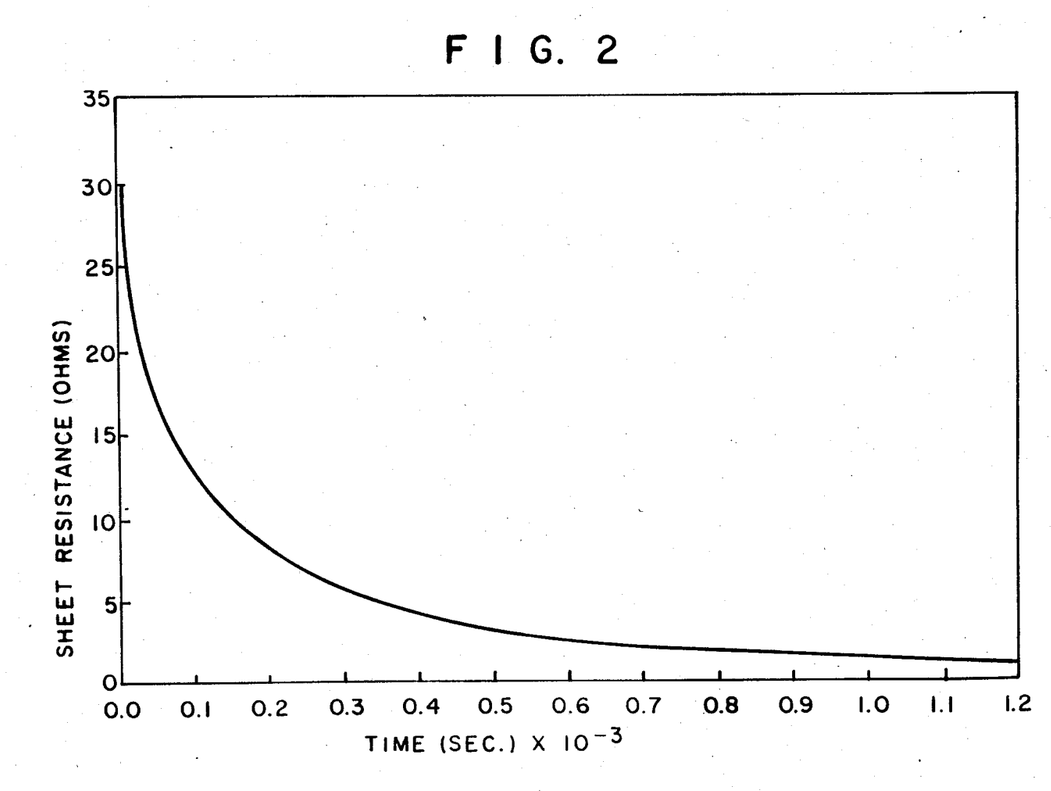
FIG. 2 is a plot which shows the increase in conductivity (decrease in sheet resistance) with time as a silver/polyimide structure of Mazur, supra, similar to that depicted in FIG. 1, is subjected to the process of the invention at 220° C.

FIG. 2 shows the variation of sheet resistance with time for a silver/polyimide sample (0.316 mg Ag/cm$^2$ interlayer in an ODA/PMDA polyimide film) held at 220° C. These results show that although sintering at 220° C. provides a marked increase in conductivity, it does not provide the conductivity of the bulk metal, proceeding to a limiting conductivity of $2.2 \times 10^4$ (ohm cm)$^{-1}$ without further substantial change, even over very long times.

Figure 3:
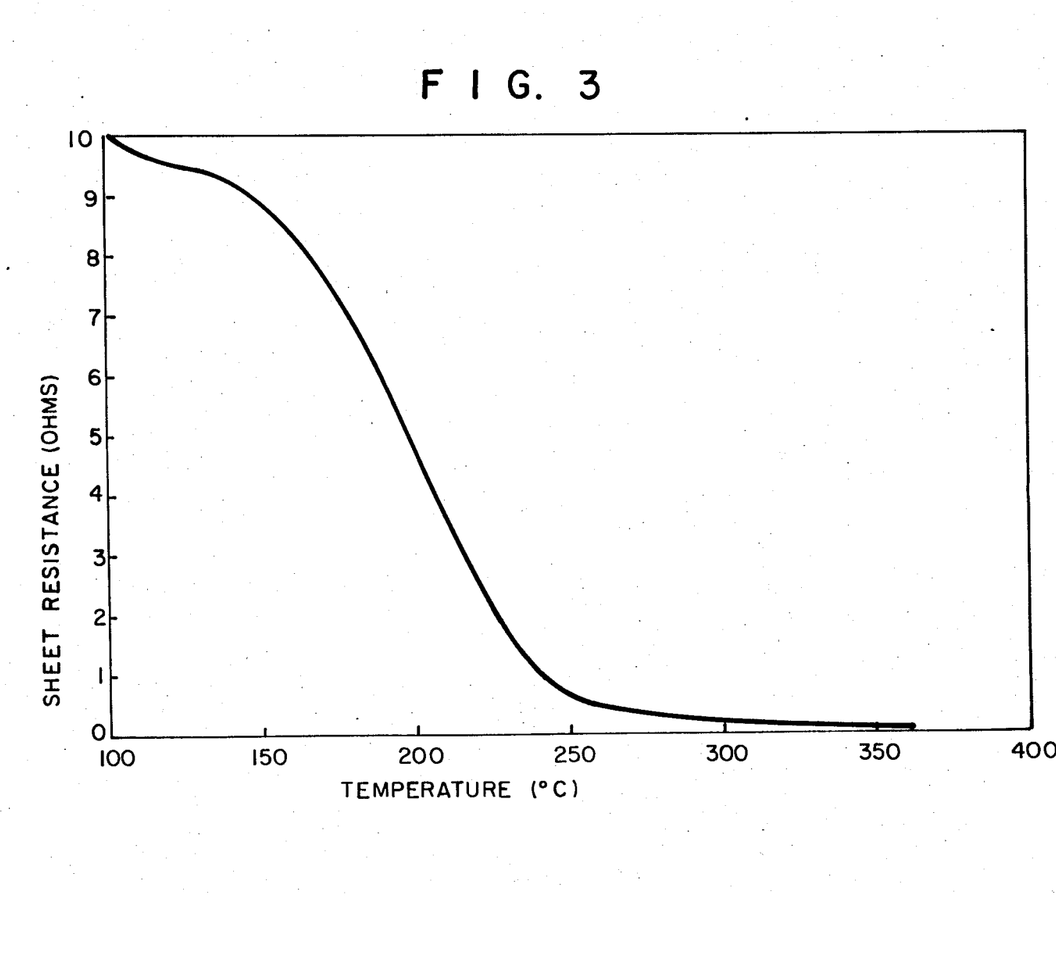
FIG. 3 is a plot which shows the increase in conductivity (decrease in sheet resistance) with temperature as a silver/polyimide structure of Mazur, supra, similar to that depicted in FIG. 1, is subjected to the process of the invention.

FIG. 3 shows the variation of sheet resistance with temperature for a silver/polyimide sample, such as described above for FIG. 2, as it was heated from 100° C. to 350° C. at the rate of 10° C./minute. The final bulk conductivity was $1.2 \times 10^5$ (ohm cm)$^{-1}$. In another experiment (not shown) a similar sample was heated at 400° C. for 10 minutes, resulting in a bulk conductivity of $6.7 \times 10^5$ (ohm cm)$^{-1}$, within 10% of that of the bulk metal.

Figure 4:
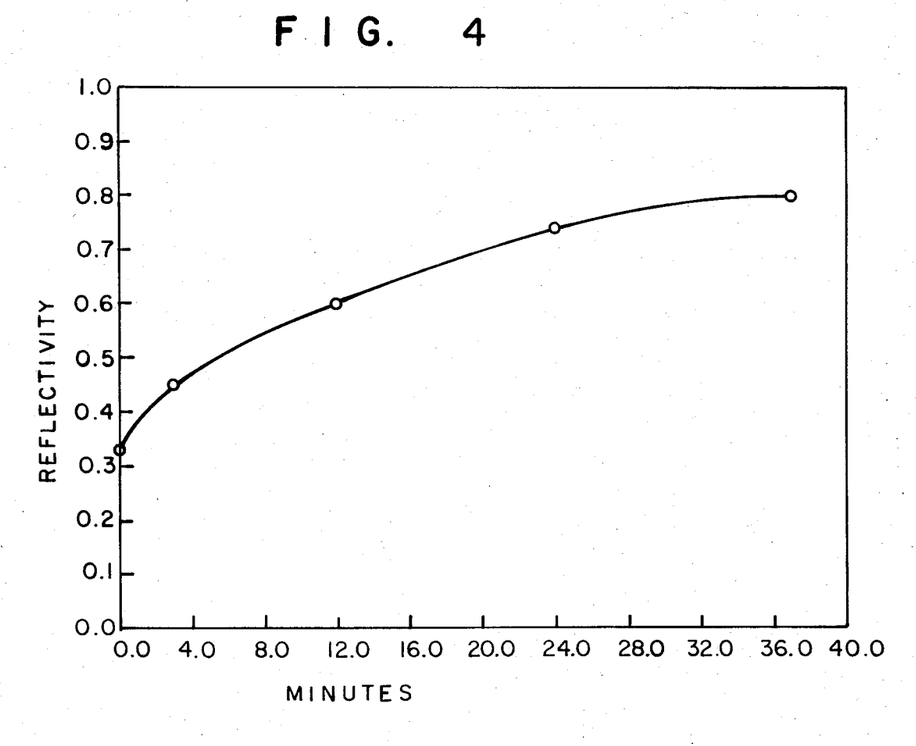
FIG. 4 is a plot which shows the increase in optical reflectivity with time as a silver/polyimide structure of Mazur, supra, similar to that depicted in FIG. 1, is subjected to the process of the invention at 450° C.

FIG. 4 shows the increase of optical reflectivity at 1000 nm wavelength as a function of sintering time at 450° C. The experiment was performed on a silver/polyimide sample (0.158 mg Ag/cm$^2$ interlayer in an ODA/PMDA polyimide film) which was quenched to room temperature whenever the reflectivity was measured, as described in Exmaple 3.

Figure 5:
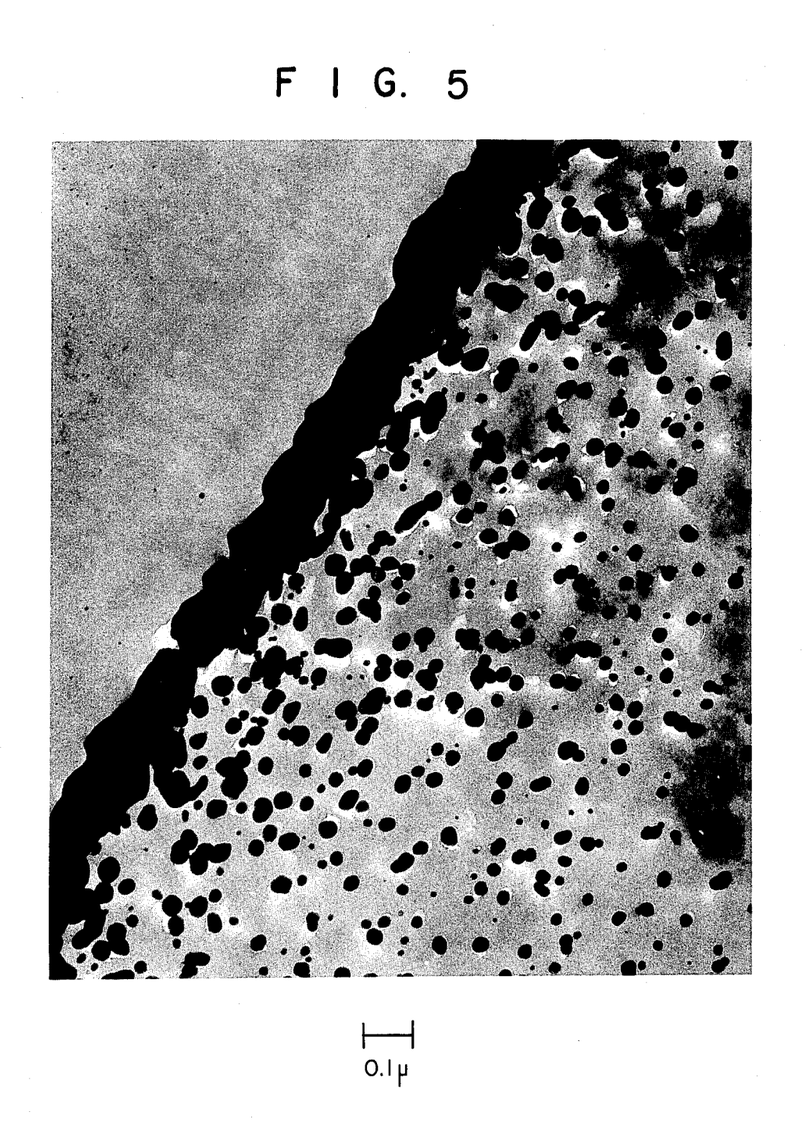
FIG. 5 depicts a transmission electron micrograph of a microtomed cross-section of the silver/polyimide structure represented by FIG. 1 after being subjected to the process of the invention by heating at 300° C. for fifteen minutes (Example 1).
Figure 6:
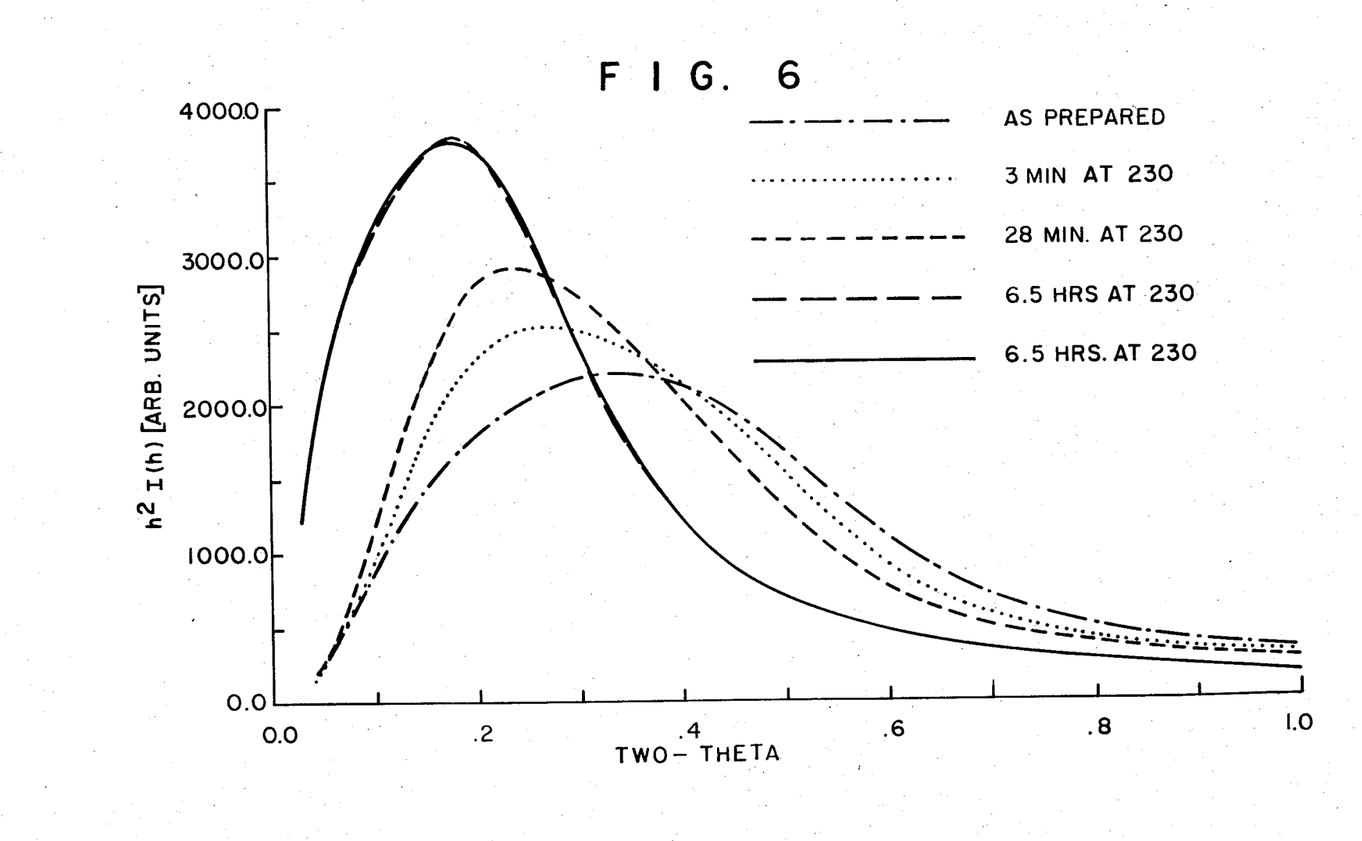
FIG. 6 is a plot which shows the variation of the product of SAXS (small angle X-ray scattering) scattering intensity and the square of the scattering vector as a function of the scattering angle as a silver/polyimide structure of Mazur, supra, similar to that depicted in FIG. 1, is subjected to the process of the invention at 230° C. for various times (Example 1).

Systematic changes in the morphology of the silver interlayer can be demonstrated using TEM and SAXS analyses. FIG. 5 depicts a TEM micrograph prepared from the same sample shown in FIG. 1, but thereafter sintered at 300° C. for 15 minutes (Example 1). In comparing these micrographs (FIGS. 1 and 5), two features are noteworthy. First, there is no apparent change in the size or number of particles in the region to the right of the interlayer where the silver particles are diffusely distributed and not in contact with adjacent particles. More importantly, however, the particles within the interlayer have clearly increased in size and formed a more unified mass. A quantitative measure of these changes is provided by SAXS. FIG. 6 shows the changes in invariant scattering function with sintering time, carrying out the process of the invention at 230° C. on a 0.158 mg Ag/cm$^2$ interlayer in an ODA/PMDA polyimide film. The peak in this function moves to lower angles, corresponding to an overall change in average particle diameter from 154 A (0.0154 μm) to 278 A (0.0278 μm). A further description of FIG. 6 is provided in Example 1. As will be apparent to one skilled in the art, the changes in optical reflectivity cannot be a consequence of the smoothing which accompanies this change in particle size, because these dimensions are more than an order of magnitude smaller than the wavelength of visible light. The physical origin of the increase in reflectivity can instead be regarded as another manifestation of the increase in electrical continuity of the interlayer. Optical reflectivity is, in effect, a measure of the conductivity sampled across distances comparable to the wavelength of the light and is, therefore, sensitive to the continuity of the particles which are of a much smaller dimension.

When a laser is employed to effect the sintering of a metal interlayer, the following considerations apply. Absorption of light by the sample produces the heat necessary to sinter the interlayer. Since this heat is simultaneously dissipated by thermal diffusion within the sample, convection, radiation, and diffusion from the external surfaces of the sample, the optimum sensitivity and spatial resolution are to be expected for conditions where the light is absorbed by the metal in the shortest period of time. A laser whose wavelength is strongly absorbed by the metal but not by the polymer is, therefore, preferred and the combination of high power density and short exposure time, for example, as short as 200 nanoseconds, is preferred to an equivalent energy provided by proportionately lower power density and longer exposure time. The examples include representative conditions for sintering to enhanced reflectivity using both continuous and pulsed lasers.

Figure 7:
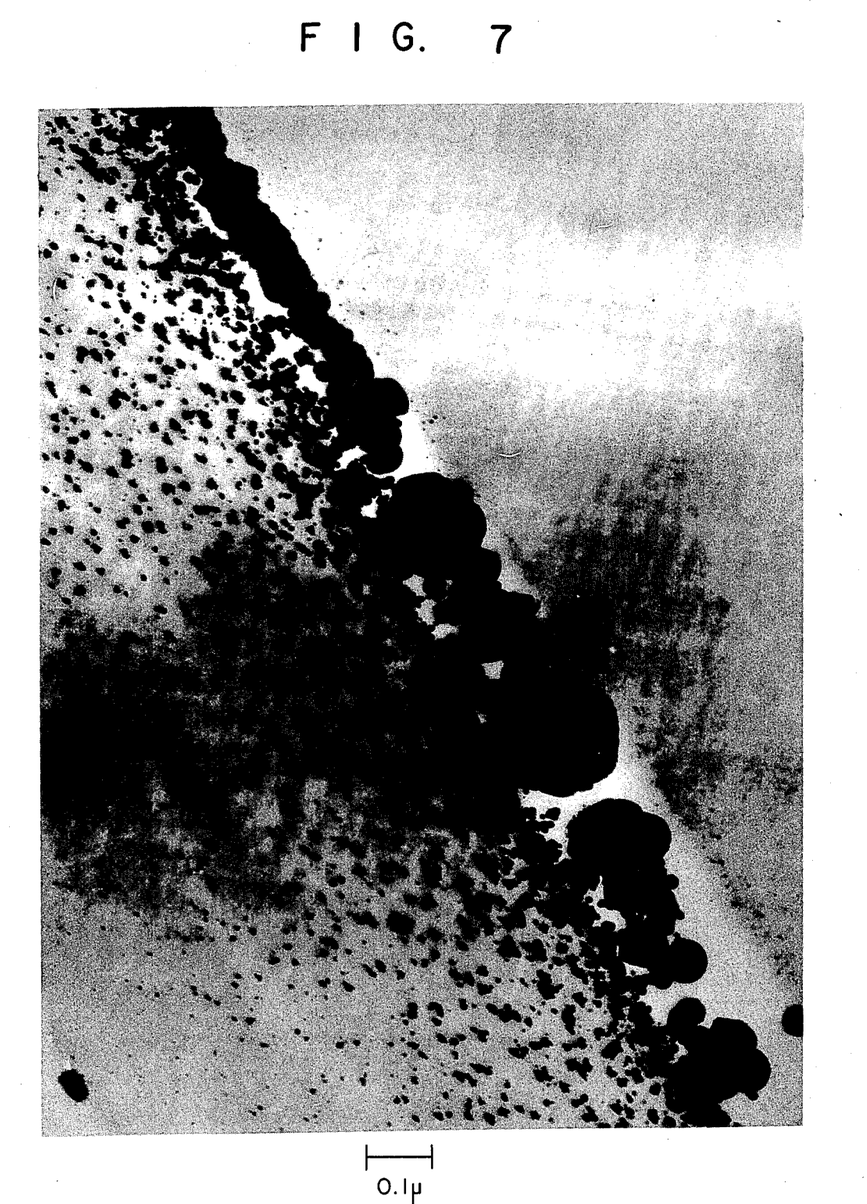
FIG. 7 depicts a transmission electron micrograph of a microtomed cross-section of a silver/polyimide structure, such as represented in FIG. 1, the lower portion of which has been subjected to the process of the invention (Example 4).

It was discovered that beyond a certain limit of exposure, a qualitatively different result is obtained. For example, exposure of a silver interlayer of thickness about 2,000 A (0.2 μm), in a polyimide film, to a CW Ar-ion laser at an energy density of 0.2 Joule/cm$^2$ (400 nsec exposure) resulted in enhanced reflectivity and no change in transmissivity. However, exposure of the same sample to 1.0 Joule/cm$^2$ energy density resulted in formation of a "gap" in the interlayer, that is, a region where the polymeric film remained intact but the interlayer had retracted to form isolated particles of approximately 2 μm (20,000 A) in diameter (FIG. 7). In these regions all of the reflectivity of the interlayer was lost and the sample became transparent. Measurements of electrical conductivity following these high exposure conditions confirmed that the continuity of the interlayer was lost, corresponding to an open circuit.

UTILITY

The process of the invention provides a means of modulating both the electrical conductivity and the optical reflectivity and transmissivity of a metal interlayer within a polymeric film over a wide range of properties, and with very high geometric resolution. The invention can be used to produce electrical and/or optical components, such as electrical resistors and conductors and mirrors, where the properties of these components may be controlled in a systematic and reproducible manner according to the principles disclosed herein. Also, the invention provides a means for producing two-dimensional patterns in which different regions of the patterns may be adjusted to different electrical and/or optical properties. Such patterns can be used as electrical circuits, graphic images, or records of digital information. The invention herein also provides an attractive and feasible means for preparing laminated or sandwich-type structures comprised of a plurality of metal interlayers in an organic polymeric film.

In the examples herein, the unsintered silver (or gold) interlayer in polyimide film was prepared by the procedure of S. Mazur, supra, U.S. Pat. No. 4,512,855. A typical process of this type is described below.

A. POLYMER FILM AND FILM COATED ELECTRODE

Polyamic acid having an $\eta_{inh}$ of 1.48 dl/g (average of $\eta_{inh}$ ranging from 1.3 to 1.7) was prepared from 4,4'-oxydianiline and pyromellitic dianhydride. A 12 wt. % solution of the polyamic acid in dry N,N-dimethylacetamide (DMAc) was filtered through a Millipore ® (10.0 μm pore) filter. A clean flat electrode, for example, an SnO$_2$-coated glass plate, was spin-coated with this solution using a Headway Research Inc. Model EC101D Photoresist Spinner at 1000 rpm. The plate was transferred to a hot plate at 80° C. for a period of 10 minutes until the polymer formed a clear, colorless solid film.

The film was converted to the polyimide structure by immersing the plate in a mixture of acetic anhydride and pyridine (equal parts by volume) for a period of two h at room temperature, by which time it acquired the typical yellow gold color of the polyimide but remained clear and adherent. The film was rinsed thoroughly with methanol and then air dried. Conversion to polyimide was confirmed by infrared analysis. The film thickness was determined using transmission electron microscopy (TEM) of microtomed cross-sections and found to be 2.17 μm.

B. ELECTROCHEMICAL CELL AND EXPERIMENTAL CONDITIONS

The metal ion deposition process can be carried out with either controlled potential or controlled current. The former requires a conventional three-electrode configuration and potentiostat; the latter does not require a reference electrode.

Figure 8:
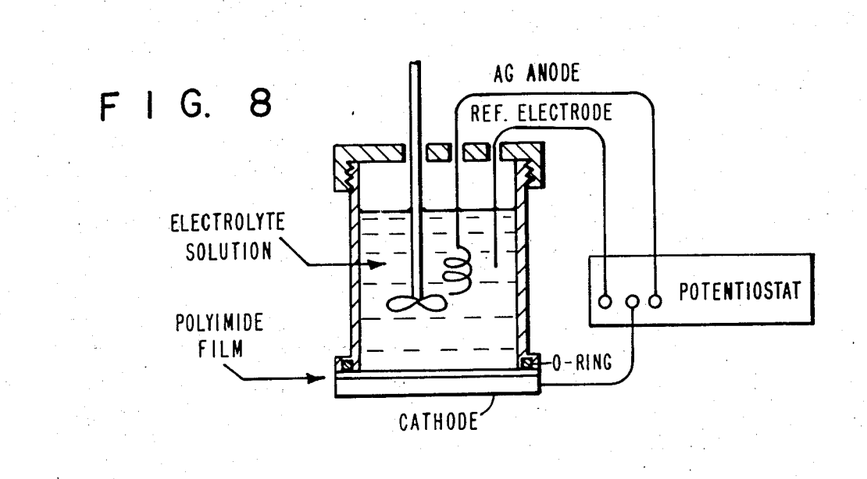
FIG. 8 is a schematic representation of the apparatus used to carry out the process of Mazur, supra, employing an electrochemical cell to provide electrons, to produce a metal interlayer/polymer film which can be used in the process of the invention.

FIG. 8 depicts a typical apparatus for the electrochemical deposition of a silver interlayer in a polyimide film by means of the process of Mazur, supra, U.S. Pat. No. 4,512,855. The cell consists of a Pyrex ® cylinder sealed to the surface of the polymer-coated cathode by means of an O-ring and clamp (not shown). The counter electrode and reference electrode are both silver wires and they are connected along with the cathode to a potentiostat (Princeton Applied Research Model 173). During operation, the electrolyte solution is stirred and purged with a stream of nitrogen (not shown). The components and their functions are as follows:

(1) The electrolyte, 0.10M tetramethylammonium hexafluorophosphate (TMAPF$_6$) in N,N-dimethylformamide (DMF), in which was dissolved AgBF$_4$ at a concentration of 0.010M, carries current and minimizes voltage drops across the solution and polymer film due to their high resistance and minimizes the influence of migration on the transport of $Ag^+$.

(2) The silver anode maintains a constant concentration of $Ag^+$ in solution. As $Ag^+$ is electrodeposited into the film, fresh ions are produced at the anode at a stoichiometrically equal rate.

(3) The potentiostat (PAR model 173) controls the potential difference between the cathode and the reference electrode at a predetermined value ($-1.30$ volts in this example) and provides the required current between cathode and anode.

(4) The cathode consists of a flat electrode, for example, an $SnO_2$-coated glass plate, having a spin-coated polyimide film which is similar to that prepared in Part A except that it is of 6 μm thickness, having been prepared from a 15 wt. % solution of polyamic acid in DMAc. A circular disc of area 7.07 cm² is exposed to the electrolyte and sealed by means of an O-ring to the bottom of the cell.

(5) The stirrer maintains homogeneity of the electrolyte, preventing polarization of the $Ag^+$ concentration.

(6) A nitrogen bubbler (not shown) maintains a continuous flow of nitrogen through the solution to preclude gradual air oxidation of the reduced polyimide.

Figure 9:
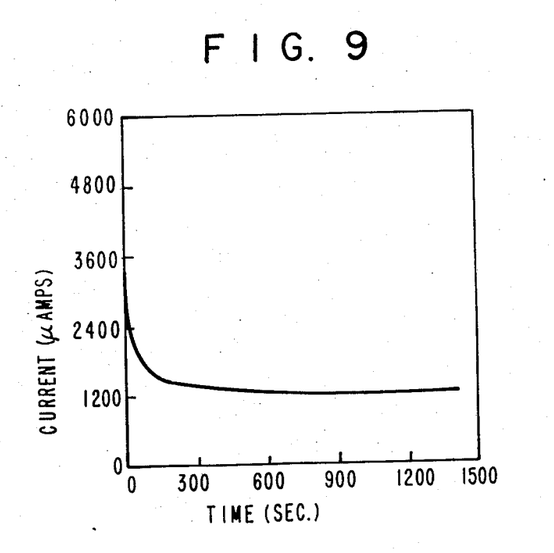
FIG. 9 is a plot of time vs. current in a typical embodiment of the process of Mazur, supra, such as carried out in the apparatus represented by FIG. 8.

The experiment was begun by adjusting the potential from $+0.30$ V (vs. an Ag wire reference electrode) to $-1.30$ V. The current measured as a function of time is shown in FIG. 9. The experiment was terminated by opening the circuit when the total amount of charge passed reached 2.0 coulombs.

The polymer film was then washed thoroughly with methanol. In appearance it was a bright gold-colored mirror when viewed from the side originally exposed to the solution and dark black when viewed through the glass cathode. The film was removed intact from the cathode by peeling it carefully away while immersed in aqueous methanol. It was allows to dry at room temperature.

A small portion of the film was cut out, potted in an epoxy resin, and microtomed in cross section. High resolution transmission electron microscopy (TEM) micrographs were recorded. Prior to potting, a thin, ca. 400 Å (0.04 μm), layer of Au/Pd was sputtered onto the cathode side of the film in order to recognize its orientation in the micrograph.

A dark band of dense silver microparticles appeared in the center of the film. Silver was identified by energy dispersive X-ray analysis (EDAX) and electron diffraction.

CONTROL OF INTERLAYER DIMENSIONS

The thickness of the metal interlayer formed under steady-state deposition conditions is proportional to the quantity of metal incorporated for a fixed surface area of polymer film. As judged by TEM of microtomed thin sections, an interlayer of 500 Å (0.05 μm) to 10,000 Å (1 μm) can be produced within a precision of ±250 Å (±0.025 μm).

It is readily apparent that this invention, as well as that of S. Mazur, provides a film structure which has been produced from a pre-existing organic polymeric film without creating or destroying external surfaces of the film. In addition, if the interlayer is sufficiently thin, there will be no substantial change in the discrete dimensions of the film.

EXAMPLE 1

Evidence for Sintering of the Silver Interlayer From TEM and SAXS Analyses

After deposition of silver (0.316 mg Ag/cm²) as an interlayer in a 10 μm-thick ODA/PMDA film, the sample was cut in two; one half was kept for 15 minutes at 300° C. under nitrogen and then both were prepared for high resolution TEM. As depicted in FIG. 5 the silver interlayer treated at 300° C. shows morphological features characteristic of a sintering process. In particular, at the sharp polymer metal interface the particles have sintered to form a smooth surface, as compared to the as-deposited interface depicted in FIG. 1 wherein the particulate nature is apparent. The sintering process for the silver interlayer was followed by means of small angle X-ray scattering (SAXS). The average diameter of the silver particles was measured as a function of annealing time at 230° C. for the silver/polyimide sample. The sintering process was carried out in a nitrogen rich atmosphere. The X-ray scattering spectra are shown in FIG. 6 wherein the angular dependence of the SAXS scattering intensity, $I(\theta)$, times the square of the scattering vector, $h^2$, (where $h=4\pi (\sin \theta)/\lambda$ with $\theta$ the scattering half angle, and $\lambda$ the X-ray wavelength), is presented. The displacement of the peak position to lower values of scattering angle accompanies growth of the particles during the sintering process. It was found that during the sintering process the average particle diameter grew from 15.4 to 27.8 nm.

EXAMPLE 2

Measurment of Sheet Resistance and Temperature Coefficient of Resistance for Silver in ODA/PMDA Films in the As-Deposited and the Sintered States The sheet resistance was measured using the "four-point probe" technique. In this method, four contacts are made to the film; current is injected across the outer pair of contacts, and the resultant voltage drop across the two remaining points is measured. The sheet resistance ($R_s$) of a layer of thickness d is proportional to the ratio of the voltage (V) to the current (I).

$$R_s = C(V/I) = (\sigma d)^{-1}$$

The constant C was measured using thin sputtered gold layer of known specific conductivity $\sigma$ and thickness d. The temperature coefficient of resistance (TCR) is defined as $(1/R)(dR/dT)$. For films thicker than, for example, 250 Å (0.025 μm). dR/dT is essentially independent of temperature and $$TCR \simeq \frac{1}{R_{rt}} \frac{(R_1 - R_{rt})}{(T_1 - T_{rt})}$$

wherein $R_{rt}$ is the resistance at room temperature $T_{rt}$ and $R_1$ is the resistance at some other temperature $T_1$. Measurements were carried out between liquid nitrogen temperature ($-196°$ C.) and 22° C. The specific conductivity and TCR values are tabulated for both as-deposited and sintered samples in the following table. It is evident that upon sintering the specific conductivity $\sigma$ increases ~1000 times, approaching that of silver metal, while the TCR increases ~10 times.

| d (Å) Thickness of the Dense Interlayer of Silver | $\sigma(\Omega^{-1} cm^{-1})$ R. T. Specific Conductivity | TCR (°K.$^{-1}$) Temperature Coefficient of Resistance |
|---|---|---|
| 1875 (as-deposited) (0.1875 μm) | $6.5 \times 10^2$ | $4.2 \times 10^{-4}$ |
| 9000 (as-deposited) (0.9 μm) | $1.7 \times 10^3$ | $6.2 \times 10^{-4}$ |
| 4400 (0.44 μm) sintered at 400° C. for 10 minutes | $6.7 \times 10^5$ | $3.6 \times 10^{-3}$ |
| Silver Metal | $6.8 \times 10^5$ | $4.1 \times 10^{-3}$ |

In another experiment the sheet resistance was measured as a function of time for a 0.316 mg Ag/cm$^2$ sample at 220° C. The experiment was performed using the four probe method. The sample was kept in a Mettler FP52 heating stage which was controlled by an FP5 temperature controller. The experiment was done in a nitrogen rich atmosphere. In FIG. 2 the evolution of the sheet resistance with time for the first 1200 seconds is shown. As the sintering process evolves in time, the sheet resistance drops by a factor of ~30.

In still another experiment a 0.316 mg Ag/cm$^2$ interlayer was prepared for a four point conductivity measurement. The sample was introduced into a Mettler FP52 heating stage which was controlled by an FP5 temperature controller. The sheet resistance of the sample was measured between 100° C. and 360° C. at a constant rate of heating of 10° C./minute. The resulting evolution of sheet resistance vs. temperature is shown in FIG. 3. A hundred fold decrease in resistivity is observed, most of which takes place between 170° C. and 250° C., well below the glass transition temperature (~380° C.) of the ODA/PMDA polymer. This example is a manifestation of the sintering process of the silver interlayer in situ in the polymer matrix.

EXAMPLE 3

Variation of Optical Reflectivity with Sintering

The reflectivity of silver interlayers was measured using a reflectance accessory for the Cary Model 2300 spectrophotometer. The specular component of the reflected light was included in the measurements. For a 0.158 mg Ag/cm$^2$ sample the reflectivity at 1000 nm wavelength was 32(+3)%. After treating the sample for 15 minutes at 420° C. the reflectivity increased to 95(±5)%. The measurements were performed with the sharp metal polymer interface facing the light beam. This large change in optical reflectivity is another manifestation of the sintering process. In another experiment a 0.158 mg Ag/cm$^2$ sample was annealed for various time intervals at 400° C. After each annealing period it was quenched to room temperature and the reflectivity at λ−1000 nm was measured. The evolution of the reflectivity parameter as a function of annealing time is presented in FIG. 4. In this experiment the progress in the sintering process is manifested by the increase in the value of the reflectivity.

EXAMPLE 4

Sintering with Nd-Yag and Argon-ion Lasers

The interlayer sintering phenomenon serves as a basis for writing information into the silver layer by an IR laser. Preliminary experiments using a Nd-YAG CW laser at 1 μm wavelength demonstrated the feasibility of the method as the area sintered by the laser beam exhibits a substantial increase in reflectivity, as observed in dark field reflection optical microscopy. For a beam of a Gaussian profile, $\sigma=5.5$ microns, at a linear scan velocity of 50 m/sec, the exposure sensitivity is ~0.3 Joule/cm$^2$. This value of sensitivity is characteristic for writing both on the cathode side (the side that was facing the solution during the electrodeposition process used to prepare the silver interlayer in polyimide film) as well as on the opposite side of the silver interlayer. The silver interlayer also can be sintered by an Argon ion laser at 488 μm wavelength using a power of 27 milliwatts of a beam focused to a 0.5 μm spot. Upon sintering, dots of higher reflectivity were observed in a phase contrast microscope. The exposure time for those spots was 250 nanoseconds and the sensitivity more than 0.4 Joule/cm$^2$. The diameter of the dots in the interlayer was 0.3–0.5 μm. Moreover, since the sintered areas exhibit much higher electrical conductivity, the sintering process can be used, in principle, to modulate spatially the local conductivity in thin films of silver in ODA/PMDA systems.

At higher laser power densities the continuity of the silver interlayer can be completely destroyed, dropping the reflectivity of the exposed regions to a very low value. This provides an additional dimension of control for recording information and modulating conductivity of the film. In FIG. 7 is depicted a TEM of a 0.158 mg Ag/cm$^2$ interlayer in polyimide film, a portion of which was sintered with a Nd-Yag CW laser at an exposure of 1.0 Joule/cm$^2$. As is apparent from FIG. 7, the sintered portion of the interlayer is discontinuous as large particles (~0.2 μm in diameter) are formed. The region exposed to the intense laser light loses its metallic luster and the electrical continuity of the interlayer is disrupted. In this experiment the lines sintered by the intense laser light are transparent when viewed in an optical microscope using a transmission mode at 200× magnification.

In another experiment an interlayer of gold (0.516 mg Au/cm$^2$) was tested with an Nd-Yag CW laser at 1 μm wavelength. The area sintered by the laser beam exhibited a substantial increase in reflectivity. This experiment was done with a beam of a Gaussian profile, $\sigma=5.5$ μm, at a linear scan velocity of 50 m/sec at an exposure level of 0.6 Joule/cm$^2$.

EXAMPLE 5

A gold interlayer in polyimide film, similar to that described in Example 4, was prepared substantially in accordance with the procedure of Mazur, supra, particularly as described prior to Example 1 herein. More specifically, a polyimide film was coated onto an SnO$_2$-coated glass electrode. Deposition was carried out using a solution 0.10M in TMAPF$_6$ and approximately 0.01M in Au(AN)$_4$PF$_6$ in DMF/AN (70/30 by volume), wherein AN, both occurrences, is acetonitrile, using an applied potential of −1.30 V vs. Ag/Ag$^+$. Reaction was stopped after passing 2.0 coulombs (electrode surface area was 7.07 cm$^2$).

The gold formed a dense interlayer very near the electrode surface of the film. Its reflectivity was 0.56 measured from the solution side of the film. When viewed under very strong illumination, it transmitted blue light but its optical density was very high. A sample of the film was pealed from the electrode surface and its dc electrical conductivity was measured using the four-probe technique. The following table lists the initial sheet resistance and approximate bulk resistivity as prepared and following sintering under various conditions:

| Sample | Sheet Resistance (ohms) | Approx. Resistivity (ohms cm) |
|---|---|---|
| As formed | 843 | $4.2 \times 10^{-2}$ |
| 230° C., 10 min. | 801 | $4.0 \times 10^{-2}$ |
| 300° C., 10 min. | 51.5 | $2.57 \times 10^{-3}$ |
| 350° C., 10 min. | 0.36 | $1.8 \times 10^{-5}$ |
| 350° C., 30 min. | 0.11 | $5.5 \times 10^{-6}$ |
| Bulk Au | — | $2.35 \times 10^{-6}$ |

An attempt was made to sinter a copper interlayer within a polyimide film under the same conditions which had been successful for sintering silver and gold. The interlayer was prepared as follows. A polyimide film was coated onto an $SnO_2$-coated glass electrode (8 μm thick, 2.54 cm² in area). Deposition was carried out using a solution 0.10M in $TMAPF_6$ and 0.02M in Cu-$(AN)_4PF_6$, wherein AN is acetonitrile, in DMF at an applied potential of $-1.30$ V versus $Ag/Ag^+$. The steady-state current was 0.52 mA and the reaction was stopped after 1.44 coulombs had been passed (0.372 mg Cu per cm²). Transmission electron microscopy revealed that the interlayer was approximately 0.5 μm thick with its surface located 0.80 μm from the solution side of the film. The optical reflectivity from the solution side was 0.16. It appeared dark and metallic from the solution side and dark black from the electrode side. The optical density was very high, but under strong illumination, the transmitted light was green in color. Electron diffraction measurements confirmed the presence of copper crystallites.

A portion of the film was heated on a hot plate at 150° C. After five minutes the appearance of the film had changed markedly. It became pale brown in color and quite transparent. The reflectivity was too low to be reliably measured. The electron diffraction lines due to copper had disappeared.

BEST MODE FOR CARRYING OUT THE INVENTION

The best mode presently contemplated for carrying out the invention is illustrated by the entire disclosure herein.

Although preferred embodiments of the invention have been illustrated and described, it is to be understood that there is no intent to limit the invention to the precise constructions herein disclosed, and it is to be further understood that the right is reserved to all changes and modifications coming within the scope of the invention as defined in the appended claims.

I claim:

1. Process for modifying in situ the electrical and/or optical properties of an electrochemically-deposited interlayer within a polyimide film, the interlayer being comprised of particulate silver and/or gold, by heating the interlayer, either in its entirety or in a spatially selective manner, so as to sinter the particulate silver and/or gold without adversely affecting the properties of the polyimide.

2. Process of claim 1 wherein the interlayer is heated in its entirety at a temperature of about 150° C. to about 450° C.

3. Process of claim 1 wherein the interlayer is heated in a spatially selective manner by means of a laser.

4. Process of claim 3 wherein the energy density output of the laser is about 0.1 to less than 1.0 Joule/cm² at a wavelength of 1 μm to 450 nm for 200 nanoseconds to 1 millisecond.

5. Process of claim 1 wherein the modification of electrical and/or optical properties provides an increase in electrical conductivity and optical reflectivity, either in the entire interlayer or in selected portions thereof.

6. Process of claim 5 wherein heating is continued until the electrical conductivity and optical reflectivity reach maxima.

7. Process of claim 6 wherein interlayer that has been heated to reach said maxima is heated further in selected portions so as to provide electrical conductivity and optical reflectivity less than the maxima.

8. Process of claim 1 wherein the film is a polyimide of 4,4'-oxydianiline and pyromellitic dianhydride, the metal is silver, the electrical conductivity of the interlayer is no greater than $6.5 \times 10^2$ (ohm cm)$^{-1}$, and the electrical conductivity of the sintered silver is at least $0.21 \times 10^5$ (ohm cm)$^{-1}$.

9. Process of claim 8 wherein the electrical conductivity of the sintered silver is at least 90% of the electrical conductivity of bulk silver metal.

10. Process of claim 1 wherein the film is a polyimide of 4,4'-oxydianiline and pyromellitic dianhydride, the metal is gold, the electrical conductivity of the interlayer is no greater than 24 (ohm cm)$^{-1}$, and the electrical conductivity of the sintered gold is at least $1.8 \times 10^6$ (ohm cm)$^{-1}$.

11. Film structure comprising an organic polymeric film within which is a sintered interlayer, the interlayer having been sintered in its entirety or in spatially-controlled portions from an unsintered interlayer, the unsintered interlayer having been formed in the film without any substantial change in the discrete dimensions of the film.

12. Film structure of claim 11 wherein there are a plurality of interlayers.

13. Film structure comprising an organic polymeric film within which is a sintered interlayer, the interlayer having been sintered in its entirety or in spatially-controlled portions from an unsintered interlayer, the unsintered interlayer having been formed in the film without any substantial change in the discrete dimensions of the film, the sintered interlayer having been produced by the process of claim 1.

14. Film structure of claim 13 wherein the sintered interlayer has been produced by heating the entire unsintered interlayer at a temperature of about 150° C. to about 450° C.

15. Film structure of claim 13 wherein the sintered interlayer has been produced by heating spatially-controlled portions of the unsintered interlayer by means of a laser.

16. Process of claim 2 wherein the interlayer is heated in its entirety at a temperature of 300° C. to 450° C.

17. Process for increasing in situ the electrical conductivity and/or the optical reflectivity of an interlayer within a polyimide film, the interlayer being comprised of particulate silver and/or gold, by heating the interlayer, either in its entirety or in a spatially selective manner, so as to sinter the particulate silver and/or gold without adversely affecting the properties of the polyimide.

18. Film structure comprising an organic polymeric film within which is a sintered interlayer, the interlayer having been sintered in its entirety or in spatially-controlled portions from an unsintered interlayer, the unsintered interlayer having been formed in the film without creating or destroying external surfaces of the film.

19. Film structure comprising an organic polymeric film within which is a sintered interlayer, the interlayer having been sintered in its entirety or in spatially-controlled portions from an unsintered interlayer, the unsintered interlayer having been formed in the film without creating or destroying external surfaces of the film, the sintered interlayer having been produced by the process of claim 1.

* * * * *